United States Patent
Park et al.

(10) Patent No.: US 7,220,668 B2
(45) Date of Patent: May 22, 2007

(54) METHOD OF PATTERNING A POROUS DIELECTRIC MATERIAL

(75) Inventors: Hyun-Mog Park, Seoul (KR); Boyan Boyanov, Portland, OR (US); Grant M. Kloster, Lake Oswego, OR (US); Vijayakumar S. RamachandraRao, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 39 days.

(21) Appl. No.: 11/169,367

(22) Filed: Jun. 28, 2005

(65) Prior Publication Data
US 2006/0292856 A1   Dec. 28, 2006

(51) Int. Cl.
*H01L 24/4763* (2006.01)

(52) U.S. Cl. .................. 438/637; 438/629; 438/653; 257/E21.584

(58) Field of Classification Search ........... 438/627, 438/629, 637, 638, 643, 653, 668, 675, 677; 257/E21.584
See application file for complete search history.

(56) References Cited

U.S. PATENT DOCUMENTS

| | | | | |
|---|---|---|---|---|
| 6,114,259 A | * | 9/2000 | Sukharev et al. | 438/789 |
| 6,537,896 B1 | * | 3/2003 | Catabay et al. | 438/474 |
| 6,913,995 B2 | * | 7/2005 | Ko | 438/643 |
| 7,015,150 B2 | * | 3/2006 | Cooney et al. | 438/765 |
| 7,057,287 B2 | * | 6/2006 | Kumar et al. | 257/758 |
| 7,087,515 B2 | * | 8/2006 | Ahn et al. | 438/618 |
| 2004/0175935 A1 | * | 9/2004 | Abell | 438/638 |
| 2005/0127515 A1 | * | 6/2005 | Knorr et al. | 438/629 |

* cited by examiner

*Primary Examiner*—Kevin M. Picardat

(57) ABSTRACT

A method of patterning a porous dielectric material that includes an ash process to treat the porous dielectric material. The treated porous dielectric material allows for the formation of a substantially continuous barrier layer, which can inhibit diffusion of, for example, a conductive material into to the dielectric material. Other embodiments are described and claimed.

18 Claims, 5 Drawing Sheets

METHOD OF PATTERNING A POROUS DIELECTRIC MATERIAL

FIELD OF THE INVENTION

The invention relates generally to the manufacture of integrated circuit devices and, more particularly, to the patterning of porous dielectric materials.

BACKGROUND OF THE INVENTION

An integrated circuit (IC) device typically comprises a semiconductor die in which circuitry has been formed, this circuitry including a collection of circuit elements such as transistors, diodes, capacitors, resistors, etc. To provide electrical connections between the die and a next-level component (e.g., a package substrate), an interconnect structure is formed over a surface of the die. The interconnect structure may comprises a number of levels of metallization, each layer of metallization separated from adjacent levels by a layer of dielectric material and interconnected with the adjacent levels by vias. The dielectric layers of the interconnect structure are often each referred to as an "interlayer dielectric" (or "ILD"). The metallization on each layer comprises a number of conductors (e.g., traces) that may route signal, power, and ground lines to and from the circuitry formed on the die.

For some IC device applications, it may be desirable to increase the I/O (input/output) density of a semiconductor die while also reducing the size of the die. To achieve such a result, it may be necessary to decrease the spacing between conductive traces in the interconnect structure formed on the die. Space reductions include reducing the spacing between traces in the same level of metallization, as well as reducing the spacing between traces in adjacent metallization levels. As the spacing between conductors of an interconnect structure decreases, the potential for coupling capacitance between closely spaced traces and propagation delays may significantly increase. The coupling capacitance and propagation delays may be minimized by reducing the dielectric constant of the material—or, more generally, the "effective" dielectric constant of the space or volume—that separates the conductive traces of the interconnect structure.

One way to reduce the coupling capacitance and propagation delays is to utilize new materials having a low dielectric constant (k) to construct the ILD layers of the interconnect structure. Another solution for lowering the dielectric constant of the ILD layers of an interconnect structure is to introduce air gaps (k=1) proximate to the conductive traces, thereby reducing the effective dielectric constant of the space between adjacent traces. A further solution to lower the dielectric constant of an ILD material is to introduce porosity into the ILD material, wherein the air-filled pores lower the effective dielectric constant of the material. The porosity may be an inherent characteristic of a dielectric material or, alternatively, porosity may be introduced into a dielectric material through processing.

DETAILED DESCRIPTION OF THE INVENTION

Figure 1:
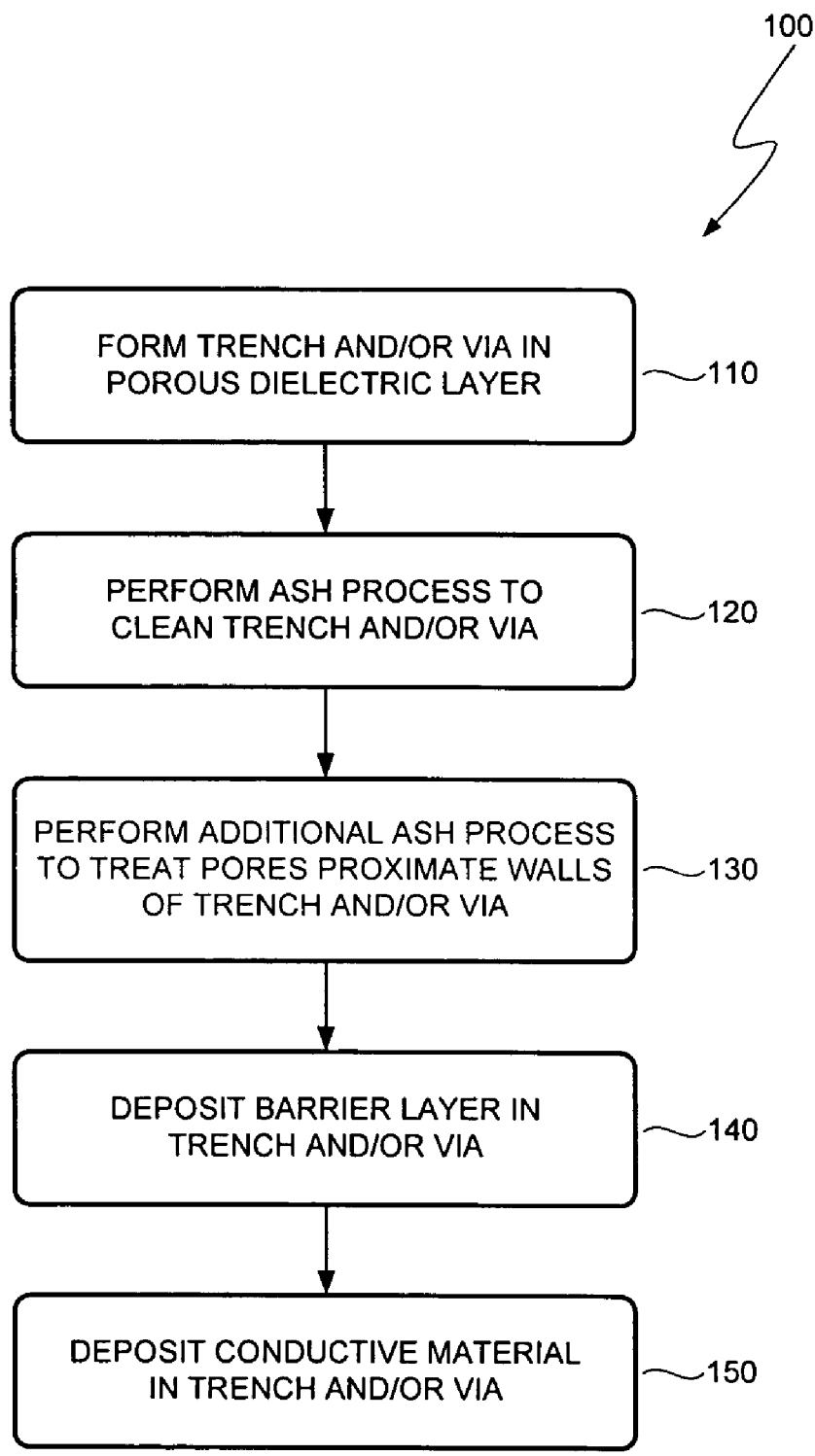
FIG. 1 is a schematic diagram illustrating an embodiment of a method of patterning a porous dielectric material.

Illustrated in FIG. 1 is an embodiment of a method of patterning a porous dielectric material. Embodiments of the method of FIG. 1 are further illustrated in the schematic diagrams of FIGS. 2A through 2D, as well as FIGS. 3A and 3B, and reference should be made to these figures as called out in the text.

Referring now to FIG. 1, and block 110 in particular, a trench and/or via (or other structure) is formed in a dielectric layer. This is further illustrated in FIG. 2A, which shows a substrate 200. In one embodiment, the substrate 200 comprises a semiconductor wafer upon which integrated circuitry for a number of die has been (or is to be) formed. However, it should be understood that the disclosed embodiments are not limited in application to semiconductor wafers and, further, that the disclosed embodiments may find use in other applications where patterning of a porous material is performed. The substrate 200 may include a base layer of a semiconductor material 210. The base layer of semiconductor material 210 may comprise any suitable material, such as silicon, silicon-on-insulator (SOI), Gallium Arsenide (GaAs), or other material or combination of materials.

In one embodiment, integrated circuitry has been formed on the base semiconductor layer 210. This integrated circuitry may include a collection of circuit elements 215, such as transistors, diodes, capacitors, and resistors, as well as signal lines and other conductors that interconnect these various circuit elements. Although only two circuit elements 215 are shown in the figures for ease of illustration, it should be understood that, in practice, a semiconductor wafer may include integrated circuitry for a number of separate die, each die including millions of transistors and other circuit elements. Therefore, as the reader will appreciate, the base semiconductor layer 210 may include hundreds of millions of such circuit elements 215.

In one embodiment, an interconnect structure 220 has been formed over the base semiconductor layer 210. In the illustrated embodiment, the interconnect structure 220 includes a layer of porous dielectric material 230. Although only a single dielectric layer 230 is shown in the figures, the reader will appreciate that, in practice, the interconnect structure 220 may include a number of levels of metallization, each level of metallization comprising a layer of the porous dielectric material in which a number of conductors (e.g., traces) has been formed. An etch stop layer (e.g., $Si_3N_4$) and/or a metal conductor (e.g., Cu) 240 may underlie the porous dielectric layer 230 (and/or underlie a via 254 formed in the dielectric layer, as explained below).

The porous dielectric material 230 may comprise any suitable dielectric or insulating material. In one embodiment, the porous dielectric material comprises carbon-doped oxide (CDO). However, other dielectric materials may also be suitable, including silicon dioxide ($SiO_2$), SiOF, a glass, or a polymer material. Porous dielectric material 230 includes a number of pores 233, and these pores 233 may be filled with air (k=1) or other suitable gas. The pores 233 may be an inherent characteristic of the dielectric material, or the pores 233 may be introduced through processing (e.g., during deposition).

The metallization of the interconnect structure 220 may comprise any suitable conductive material. In one embodiment, the metallization comprises copper (Cu). However, other conductive materials may also be used, including aluminum (Al), gold (Au), silver (Ag), and alloys of these and/or other metals.

Figure 2A:
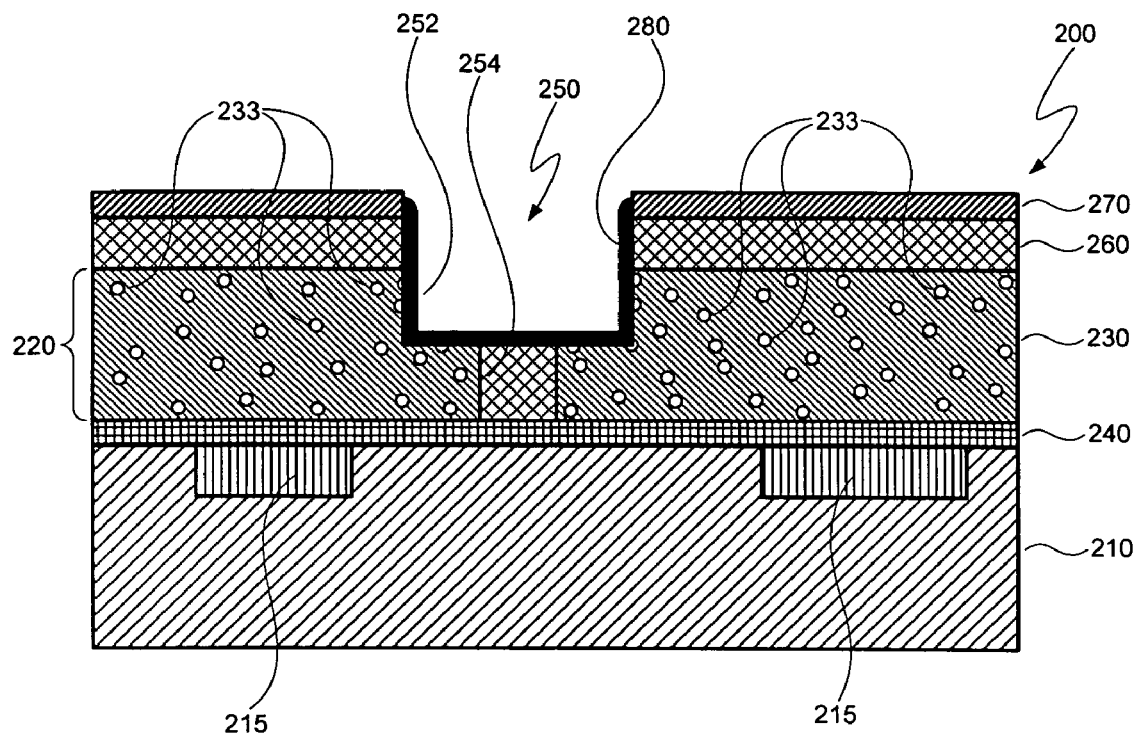
FIGS. 2A–2D are schematic diagrams illustrating various embodiments of the method shown in FIG. 1.

As also shown in FIG. 2A, a dual damascene structure 250 has been formed in the porous dielectric layer 230. According to one embodiment, the dual damascene structure 250 includes a trench 252 and a via 254. In one embodiment, the via 254 is formed first; however, a trench-first process may also be employed. The disclosed embodiments are described herein in the context of the exemplary dual damascene structure of FIGS. 2A through 2D, but it should be understood that the disclosed embodiments are applicable to any other structure that has been patterned into the porous dielectric layer 230. For example, a patterned structure may include trenches, vias, as well as any combination of trenches and vias, or other desired structure.

The trench 252 and via 254 may each be formed by any suitable etching process, such as a wet chemical etch or a plasma etching process. To carry out the etching process, a layer of SLAM (Sacrificial Light Absorbing Material) 260 and a layer of photoresist 270 may have been deposited on the substrate 200 and patterned. The SLAM and photoresist may each comprise any suitable material. In one embodiment, each of the SLAM and photoresist materials 260, 270 comprises a material that is amenable to removal by an ash process performed using a combination of helium (He) and hydrogen (H). Also, after etching, an etch residue 280 may remain, and in one embodiment this etch residue is also amenable to removal by an ash process performed using an He/$H_2$ chemistry.

Figure 2B:
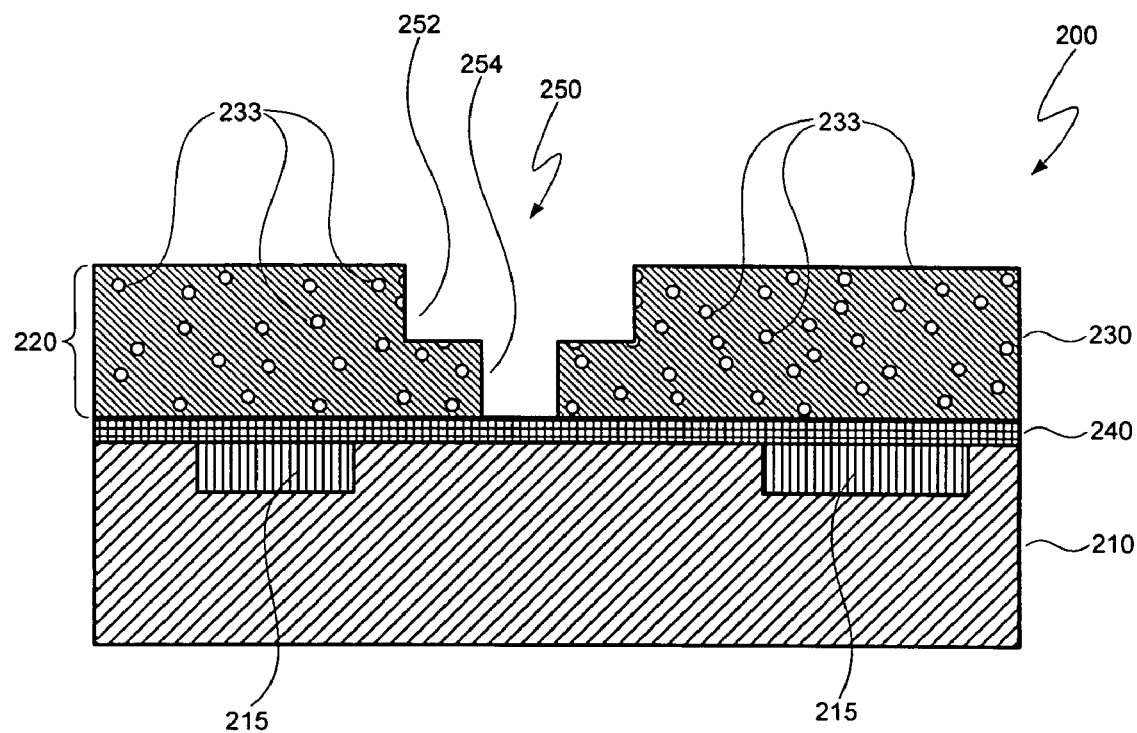

Referring block 120 in FIG. 1, an ash process is performed to clean the trench and/or via (and other surfaces of the substrate). This is illustrated in FIG. 2B, where an ash process has been performed to remove the SLAM and photoresist layers 260, 270, as well as to remove the etch residue 280. According to one embodiment, the ash process is performed using a mixture of helium and hydrogen. In one embodiment, the He/$H_2$ mixture comprises between 1 and 5 percent hydrogen and up to 99 percent helium. In another embodiment, the substrate 200 is placed in a processing chamber, and the He/$H_2$ mixture is introduced into the chamber at a flow rate of between 1,000 and 5,000 sccm. In further embodiments, during the ash process, the processing chamber (and/or substrate 200) is maintained at a temperature of between 200 and 300 degrees Celsius, and the chamber is maintained at a pressure of between 400 and 4,000 mTorr. In yet another embodiment, to clean the dual damascene structure 250 and remove the SLAM and photoresist layers 260, 270, the substrate 200 is exposed to the ash process for between 30 and 60 seconds. It should be noted that, in some embodiments, one or more of these material layers (e.g., SLAM layer 260) may be removed by an alternative process (e.g., a wet cleaning process).

Ultimately, a conductive material such as copper will be deposited in the trench 252 and via 254 to form a conductive path within the interconnect structure 220. However, the pores 233 in the dielectric layer 230 may promote diffusion of this conductive material into the dielectric layer 230. Diffusion of conductive material into the dielectric layer 230 may lead to electrical failure (e.g., shorting, capacitive coupling, propagation delays, etc.).

Referring to block 130 in FIG. 1, to prevent or minimize diffusion into the porous dielectric layer 230, an additional ash process is performed to treat the porous dielectric material 230 (e.g., the dielectric material proximate the walls of the trench 252 and via 254). The dielectric material proximate the walls of the trench and via 252, 254 is treated to reduce or substantially eliminate the dielectric material's susceptibility to diffusion (e.g., diffusion of a conductive material into pores 233 proximate the walls of the trench and via). The manner in which the dielectric material proximate the walls of dual damascene structure 250 is treated is explained in greater detail below with respect to FIGS. 3A and 3B.

In one embodiment, the additional ash process to treat the dielectric material is performed using the same ash chemistry (and other process parameters) as that used to perform cleaning (see block 120). According to one embodiment, after cleaning, the ash process is continued for an additional period of time to treat the porous dielectric material 230. For example, the ash process may be carried out for an additional period of time of between 1 and 2 minutes. In other embodiments, however, the ash chemistry and other process parameters used to treat the porous dielectric material (see block 130) may be different than that used to perform cleaning (see block 120), and treatment of the porous dielectric material may be performed using any suitable ash chemistry under any suitable process conditions.

Figure 3A:
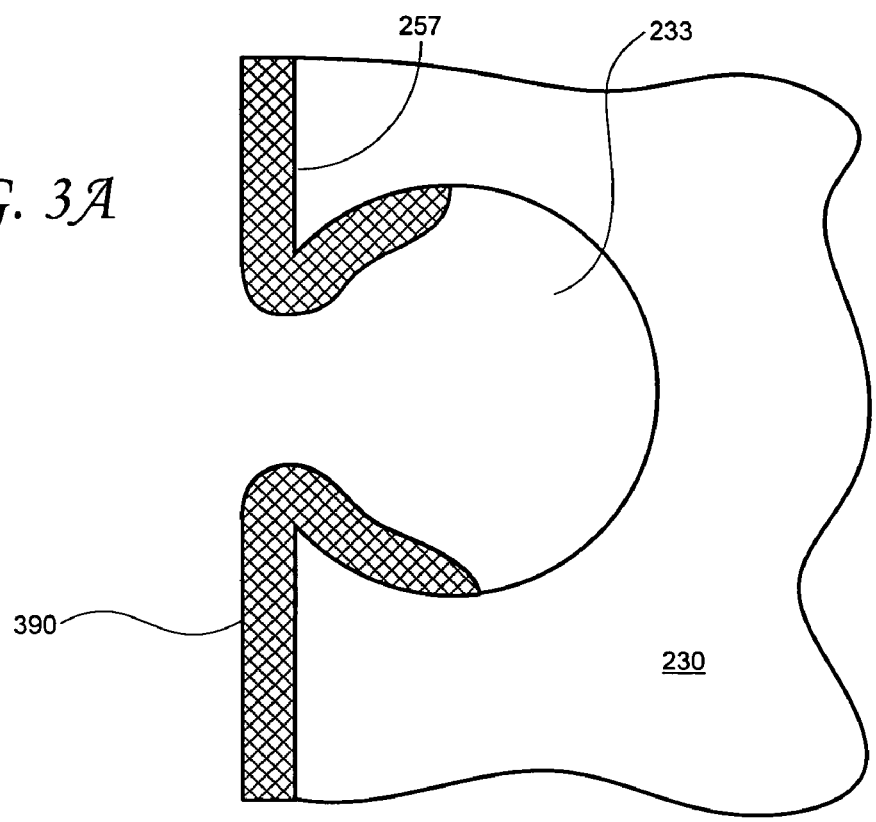
FIGS. 3A–3B are schematic diagrams illustrating further embodiments of the method shown in FIG. 1.
Figure 3B:
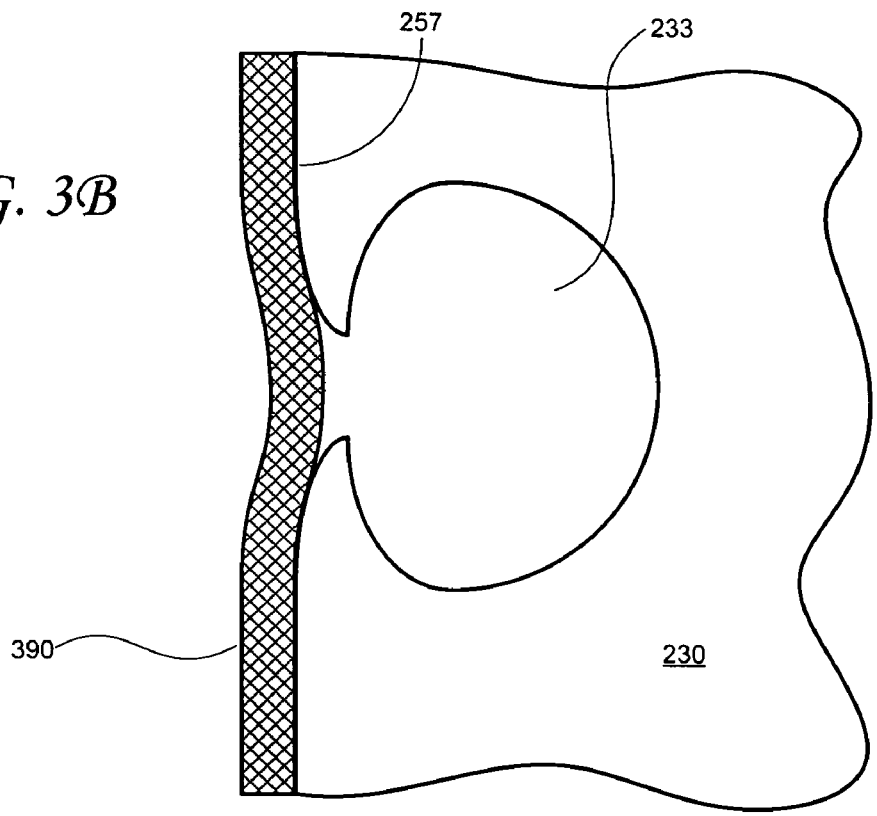

Referring now to FIG. 3A, illustrated is an example of a pore 233 in dielectric material 230 that is located proximate a wall 257 of the dual damascene structure 250 (e.g., either trench 252 or via 254). Should a barrier layer 390 be deposited on the wall 257, the barrier layer may be interrupted at the pore 233, resulting in an un-sealed pore. Thus, the pore 233 proximate wall 257 may serve as an initiation point for diffusion into the dielectric material 230. Turning next to FIG. 3B, the pore 233 on wall 257 is shown after the ash process. Surface damage has occurred which has reduced the size of the pore 233. A barrier layer 390 deposited on wall 257 may now cover the pore 233, sealing the pore and inhibiting diffusion at this location. Generally, the porous dielectric material 230 may be treated by any mechanism that reduces the size of pores proximate the walls of the dual damascene structure 250 (or any other structure patterned into the porous dielectric material 230).

Figure 2C:
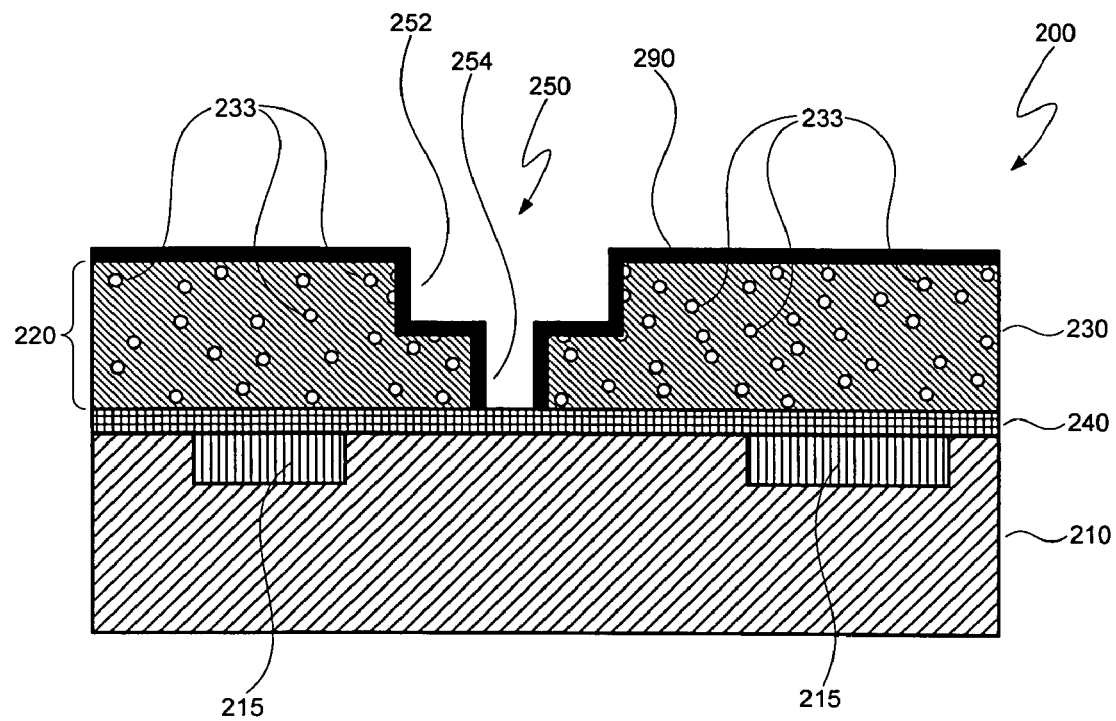

Returning to FIG. 1, a barrier layer may be deposited on the substrate and within the trench and/or via, as set forth in block 140. This is illustrated in FIG. 2C, where a barrier layer 290 has been deposited over the porous dielectric layer 230 and over the walls of the trench 252 and via 254. Because at least a portion of the porous dielectric material 230 has been treated (see block 130), the barrier layer 290 may be substantially continuous, as those pores 233 in the dielectric layer proximate the walls of dual damascene structure 250 have been reduced in size, which can assist in preventing voids in the barrier layer. Barrier layer 290 may comprise any material capable of preventing or substantially inhibiting diffusion of a conductive material into the dielectric material 230. For example, the barrier layer may comprise Ta, TaN, or Ru, as well as combinations of these and/or other diffusion barrier materials. The barrier layer 290 may, in one embodiment, be deposited using any suitable blanket deposition technique, such as chemical vapor deposition (CVD), physical vapor deposition (PVD), or atomic layer deposition (ALD).

Figure 2D:
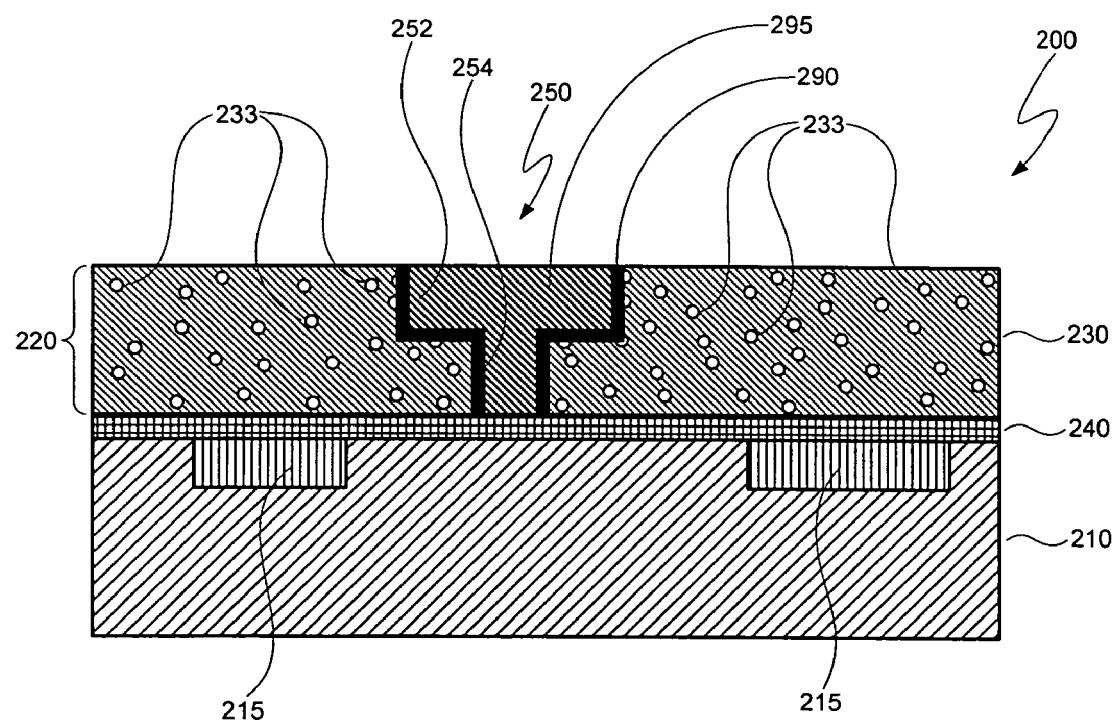

Referring to block 150 in FIG. 1, a conductive material may then be deposited within the trench and/or via and over the barrier layer. This is illustrated in FIG. 2D, where a conductive material 295 has been deposited over the barrier layer 290 within the trench and via 252, 254. Conductive material 295 may comprise any suitable conductor, and in one embodiment the conductive material comprises copper (Cu) or a copper alloy. However, the reader will appreciate that other conductive materials may be suitable, including aluminum (Al), Gold (Au), Silver (Ag), as well as alloys of these and/or other metals. The conductive material 295 may be deposited using any suitable method. In one embodiment, the conductive material is deposited using a blanket deposition technique (e.g., CVD). In a further embodiment, as shown in FIG. 2D, a planarization process is performed to remove excess conductive material and excess barrier layer material.

Figure 4:
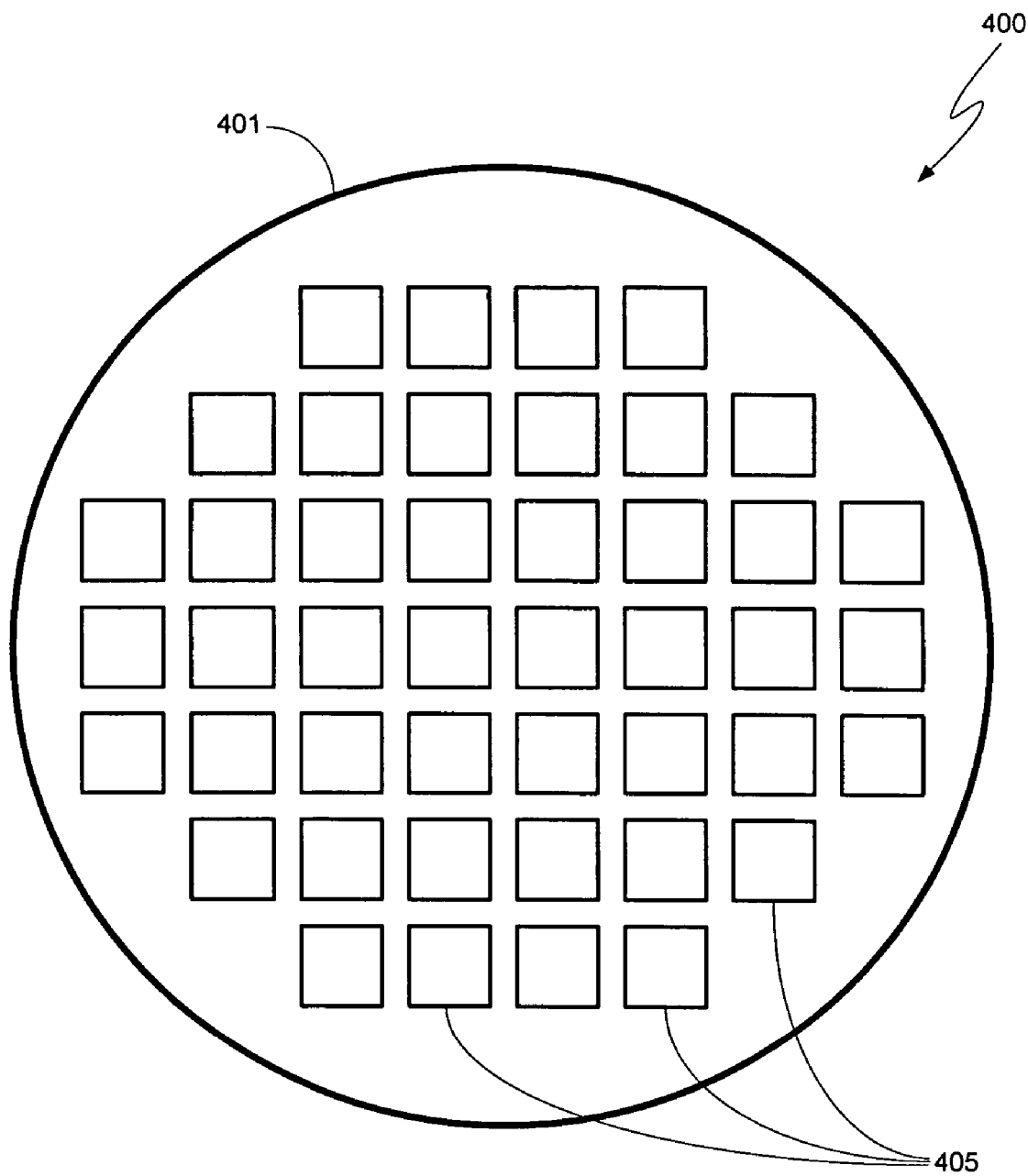
FIG. 4 is a schematic diagram illustrating an embodiment of a wafer upon which a layer of dielectric material may be patterned according to any of the disclosed embodiments.

Although the substrate 200 (and interconnect structure 220) shown in FIGS. 2A through 2D includes just a single trench and via 252, 254 for ease of illustration, it should be understood that the disclosed embodiments of a method of patterning a porous dielectric material may be performed at the wafer level and that such a wafer may include integrated circuitry and the accompanying interconnect structure for a number of separate die. Thus, the substrate 200 may, in practice, include tens of thousands or even millions of such trenches and/or vias 252, 254. This is further illustrated in FIG. 4 which shows a plan view of a wafer 400. The wafer 400 comprises a substrate 401 (e.g., Si, SOI, GaAs, etc.) upon which integrated circuitry for a number of die 405 has been formed, and wafer 400 is ultimately cut into these separate die 405. In practice, each of the die 405 may include an interconnect structure having hundreds or perhaps thousands of the trenches and/or vias 252, 254.

The foregoing detailed description and accompanying drawings are only illustrative and not restrictive. They have been provided primarily for a clear and comprehensive understanding of the disclosed embodiments and no unnecessary limitations are to be understood therefrom. Numerous additions, deletions, and modifications to the embodiments described herein, as well as alternative arrangements, may be devised by those skilled in the art without departing from the spirit of the disclosed embodiments and the scope of the appended claims.

What is claimed is:

1. A method comprising:
    forming a feature in a layer of a porous material, the feature having a sidewall;
    performing an ash process to treat pores proximate the sidewall;
    depositing a layer of a barrier material directly on the sidewall, the barrier layer substantially sealing the treated pores; and
    depositing a layer of a metal over the barrier layer, the barrier layer inhibiting diffusion of the metal layer into the porous layer.

2. The method of claim 1, wherein the porous material comprises dielectric material.

3. The method of claim 1, wherein the ash process is performed using a mixture of helium and hydrogen.

4. The method of claim 1, wherein at least some of the treated pores each have an opening at the sidewall that is reduced in size during the ash process.

5. A method comprising:
    forming a feature in a layer of porous material, the feature having a sidewall, wherein the porous material includes a number of pores proximate the sidewall, each of these pores having an opening at the sidewall;
    inducing surface damage in the porous material at the sidewall to reduce a size of the opening of the pores proximate the sidewall;
    depositing a layer of a barrier material directly on the sidewall, the barrier layer being substantially continuous over the pores proximate the sidewall; and
    depositing a layer of a metal over the barrier layer, the barrier layer inhibiting diffusion of the metal layer into the porous layer.

6. The method of claim 5, wherein the surface damage is induced using an ash process.

7. The method of claim 5, wherein the feature comprises at least one of a trench and a via.

8. A method comprising:
    forming a dual damascene structure in a layer of porous dielectric material, the dual damascene structure including a sidewall, wherein the porous dielectric material includes a number of pores proximate the sidewall;
    subjecting the porous dielectric layer to a mixture of hydrogen and helium to reduce a size of the pores proximate the sidewall;
    depositing a barrier layer directly on the sidewall of the dual damascene structure, the barrier layer substantially sealing the pores proximate the sidewall; and
    depositing a layer of a metal over the barrier lava, the barrier layer inhibiting diffusion of the metal layer into the porous dielectric layer.

9. The method of claim 8, wherein the baffler layer comprises a material selected from a group consisting of Ta, TaN, and Ru.

10. The method of claim 9, wherein the metal material comprises copper.

11. The method of claim 8, wherein the mixture comprises up to 5 percent hydrogen and up to 99 percent helium.

12. A method comprising:
    forming a dual damascene structure in a layer of porous dielectric material disposed on a substrate, the dual damascene structure having a sidewall and including a via extending down to an underlying conductor;
    performing an ash process to clean the substrate;
    continuing the ash process to treat pores in the porous dielectric material proximate the sidewall; and
    depositing a substantially continuous barrier layer directly on the sidewall.

13. The method of claim 12, wherein at least a portion of the ash process is performed using a mixture including up to 5 percent hydrogen and up to 99 percent helium.

14. The method of claim 13, wherein the mixture is introduced into processing chamber holding the substrate at a flow rate up to 5,000 sccm.

15. The method of claim 14, wherein at least a portion of the ash process is performed at a temperature up to 300 degrees Celsius.

16. The method of claim 15, wherein at least a portion of the ash process is performed at a pressure up to 4,000 mTorr.

17. The method of claim 12, wherein the ash process is continued for up to 2 minutes to treat the pores.

18. The method of claim 12, wherein the ash process is continued for up to 1 minutes to clean the substrate.

* * * * *